United States Patent
Liu et al.

(10) Patent No.: US 9,042,841 B2
(45) Date of Patent: May 26, 2015

(54) SYSTEM AND METHOD FOR PUCCH SUBBAND FEEDBACK SIGNALING IN A WIRELESS NETWORK

(75) Inventors: Lingjia Liu, Allen, TX (US); Jianzhong Zhang, Plano, TX (US)

(73) Assignee: SAMSUNG ELECTRONICS CO., LTD., Suwon-Si (KR)

( * ) Notice: Subject to any disclaimer, the term of this patent is extended or adjusted under 35 U.S.C. 154(b) by 694 days.

(21) Appl. No.: 13/231,710

(22) Filed: Sep. 13, 2011

(65) Prior Publication Data
US 2012/0069917 A1    Mar. 22, 2012

Related U.S. Application Data

(60) Provisional application No. 61/384,156, filed on Sep. 17, 2010.

(51) Int. Cl.
| | |
|---|---|
| H04B 1/00 | (2006.01) |
| H04B 7/00 | (2006.01) |
| H04W 4/00 | (2009.01) |
| H04L 1/00 | (2006.01) |
| H04B 7/06 | (2006.01) |

(52) U.S. Cl.
CPC ............ *H04L 1/0027* (2013.01); *H04B 7/0623* (2013.01); *H04B 7/0636* (2013.01); *H04L 1/0031* (2013.01)

(58) Field of Classification Search
USPC ................................ 455/68, 69; 370/328, 329
See application file for complete search history.

(56) References Cited

U.S. PATENT DOCUMENTS

| | | | |
|---|---|---|---|
| 2009/0207784 A1 | 8/2009 | Lee et al. | |
| 2009/0257383 A1 | 10/2009 | Lee et al. | |
| 2010/0002664 A1 | 1/2010 | Pan et al. | |
| 2010/0091892 A1 | 4/2010 | Gorokhov | |
| 2012/0063500 A1* | 3/2012 | Wang et al. | 375/224 |
| 2013/0028225 A1* | 1/2013 | Ko et al. | 370/329 |

FOREIGN PATENT DOCUMENTS

| | | |
|---|---|---|
| EP | 1 750 408 A2 | 2/2007 |
| EP | 2 560 296 A2 | 2/2013 |
| EP | 2 560 297 A2 | 2/2013 |
| EP | 2 560 298 A2 | 2/2013 |

OTHER PUBLICATIONS

European Search Report dated Jul. 17, 2013 in connection with European Patent Application No. 11181656.7, 11pages.

(Continued)

*Primary Examiner* — Nguyen Vo

(57) ABSTRACT

A mobile station for use in a wireless network. The mobile station transmits feedback reports to a base station of the wireless network. The feedback reports comprise a first feedback report, a second feedback report and a third feedback report. The first feedback report includes a precoder type indication (PTI) value that indicates at least one of a period of the second feedback report and a period of the third feedback report. The PTI value indicates a ratio of the second feedback report period to the third feedback report period. The PTI value also indicates the selected feedback information contained in the second feedback report and the third feedback report.

20 Claims, 4 Drawing Sheets

(56) References Cited

OTHER PUBLICATIONS

3GPP TSG RAN WG1 G2; "Way Forward on CSI Feedback for Re1.10 DL MIMO" Madrid, Spain; XP050598649; Aug. 23-27, 2010; Alcatel-Lucent; 6 pages.
3GPP TSG RAN WG1 G2; "Way Forward on CSI Feedback for Re1.10 DL Mimo" Madrid, Spain; XP050598692; Aug. 23-27, 2010; Alcatel-Lucent; 5 pages.
3GPP TSG-RAN Meeting #62; "Introduction of Rel-10 LTE-Advanced features in 36.212" R1-105097; Madrid, Spain, Aug. 23-27, 2010; 86 pages.
3GPP TSG-RAN Meeting #62; Introduction of Rel-10 LTE-Advanced features in 36.213 R1-105111; Madrid, Spain, Aug. 23-27, 2010; 81 pages.
International Search Report dated Feb. 24, 2012 in connection with International Patent Application No. PCT/KR2011/006868.

* cited by examiner

SYSTEM AND METHOD FOR PUCCH SUBBAND FEEDBACK SIGNALING IN A WIRELESS NETWORK

CROSS-REFERENCE TO RELATED APPLICATION(S) AND CLAIM OF PRIORITY

The present application is related to U.S. Provisional Patent Application No. 61/384,156, filed Sep. 17, 2010, entitled "FEEDBACK SIGNALING DESIGN FOR PUCCH SUBBAND FEEDBACK". Provisional Patent Application No. 61/384,156 is assigned to the assignee of the present application and is hereby incorporated by reference into the present application as if fully set forth herein. The present application hereby claims priority under 35 U.S.C. §119(e) to U.S. Provisional Patent Application No. 61/384,156.

TECHNICAL FIELD

The present application relates generally to wireless networks and, more specifically, to feedback signaling for physical uplink control channel (PUCCH) subbands in Long Term Evolution Advanced (LTE-A) wireless systems.

BACKGROUND

In $3^{rd}$ Generation Partnership Project Long Term Evolution (3GPP LTE), Orthogonal Frequency Division Multiplexing (OFDM) is adopted as a downlink (DL) transmission scheme.

The 3GPP LTE (Long Term Evolution) standard is the last stage in the realization of true 4th generation (4G) mobile telephone networks. Most major mobile carriers in the United States and several worldwide carriers have announced plans to convert their networks to LTE beginning in 2009. LTE is a set of enhancements to the Universal Mobile Telecommunications System (UMTS). Much of 3GPP Release 8 focuses on adopting 4G mobile communications technology, including an all-IP flat networking architecture.

The 3GPP LTE standard uses orthogonal frequency division multiplexing (OFDM) for the downlink (i.e., from the base station to the mobile station). Orthogonal frequency division multiplexing (OFDM) is a multi-carrier transmission technique that transmits on many orthogonal frequencies (or subcarriers). The orthogonal subcarriers are individually modulated and separated in frequency such that they do not interfere with one another. This provides high spectral efficiency and resistance to multipath effects.

The following documents and standards descriptions are hereby incorporated into the present disclosure as if fully set forth herein: 1) Document No. R1-101683, "Way Forward For Rel-10 Feedback Framework", February 2010; 2) Document No. R1-102579, "Way Forward On Release 10 Feedback", RAN WG1, April 2010; 3) Document No. R1-103419, "Way Forward on CSI Feedback Design For Rel-10 LD MIMO", May 2010; 4) Document No. R1-103332, "Way Forward On UE Feedback", May 2010; 5) Document No. R1-103333, "Refinements of Feedback And Codebook Design", May 2010; 6) Document No. R1-103805, "Double Codebook Performance Evaluation", June 2010; 7) Document No. R1-103701, "8Tx Codebook Design", June 2010; and 8) 3GPP Technical Specification No. 36.211.

In Release 10 LTE systems, a mobile station (or user equipment) performs feedback of precoder matrix index (PMI), rank indicator (RI), and channel quality indicator (CQI) to the base station (or eNodeB). In the 3GPP RAN1 #60 meeting, a way forward on feedback in Release 10 was agreed upon. Release 10 uses implicit feedback of precoder matrix index (PMI), rank indicator (RI), and channel quality indicator (CQI). The user equipment (UE) or mobile station (MS) spatial feedback for a subband represents a precoder and CQI is computed based on the assumption that the eNodeB or base station (BS) uses a specific precoder (or precoders), as given by the feedback, on each subband within the CQI reference resource. It is noted that a subband may correspond to the whole system bandwidth.

A precoder for a subband is composed of two matrices. The precoder structure is applied to all transmit (Tx) antenna array configurations. Each of the two matrices belongs to a separate codebook. The codebooks are known (or synchronized) at both the base station (eNodeB) and the mobile station (user equipment). Codebooks may or may not change over time for different subbands. The two codebook indices together determine the precoder. One of the two matrices targets the wideband or long-term channel properties. The other matrix targets the frequency-selective or short-term channel properties. It is noted that a matrix codebook in this context should be interpreted as a finite, enumerated set of matrices that, for each resource block (RB), is known to both the mobile station (or UE) and the base station (or eNodeB). It is also noted that a Release 8 precoder feedback may be deemed a special case of this structure.

Two messages are conveyed in this way: 1) Release 10 feedback will be based on implicit feedback similar to Release 8 feedback; and 2) two codebook indices will specify a precoder in Release 10, with one codebook targeting wideband and/or long-term channel properties and the other codebook targeting frequency-selective and/or short-term channel properties.

In the RAN1 #60 bis meeting, another way forward on mobile station (or UE) feedback in Release 10 was also agreed upon. A precoder, W, for a subband is a function of two matrices, W1 and W2, (i.e., where W1∈ C1 and W2∈ C2). W1 is also referred to as a first: PMI, and W2 is also referred to as a second PMI in this disclosure. The codebooks C1 and C2 are codebook 1 and codebook 2, respectively. The first PMI targets wideband (or long-term) channel properties. The second PMI targets frequency-selective (or short-term) channel properties. For the physical uplink control channel (PUCCH), the feedback corresponding to the first PMI and the second PMI may be sent in different or the same subframe, unless the payload is too large to send the first PMI and the second PMI in the same subframe on PUCCH. Also, periodic and aperiodic reports are independent.

Thus, there is an important difference in feedback between Release 8 (Rel-8) and Release 10 (Rel-10) of 3GPP networks. In Release 8, only one codebook index specifies a precoder. However, in Release 10, two codebook indices specify a precoder. Furthermore, these two codebook indices in Release 10 may be sent in different subframes or in the same subframe.

In the RAN1 #62 bis meeting, a way forward on the signaling for Physical Uplink Control Channel (PUCCH) subband feedback was agreed upon. Specifically, three PUCCH feedback modes are agreed with two (2) candidates for the extension of Rel-8 PUCCH mode 1-1 and one (1) candidate for the extension of Rel-8 PUCCH mode 2-1.

More specifically, the candidate for the PUCCH subband feedback (extension of Rel-8 PUCCH mode 2-1) is as follows. A precoder, W, for a subband is determined from 3-subframe report conditioned upon the latest rank indicator (RI) report. The reporting format comprises 3 Reports. Report 1 includes RI and 1-bit precoder type indication (PTI). In Report 2, if PTI=0, then W1 is reported. If PTI=1, then wideband CQI and wideband W2 are reported. In Report 3, if PTI=0, then wideband CQI and wideband W2 are reported. If PTI=1, then subband CQI and subband W2 are reported. For 2 and 4 transmit (TS) antennas, the PTI value is assumed to be set to 1 and is not signaled.

Therefore, there is a need in the art for improved devices and methods for providing feedback information related to CQI, PMI, and RI in Rel-10 wireless networks. In particular, there is a need in the art for improved devices and methods for providing feedback information related to CQI, PMI, and RI in Rel-10 wireless networks that minimize overhead signaling while improving the granularity of the feedback information.

SUMMARY

A mobile station is provided for use in a wireless network. The mobile station transmits feedback reports to a base station of the wireless network. The feedback reports comprise a first feedback report, a second feedback report and a third feedback report. The first feedback report includes a precoder type indication (PTI) value. The PTI value indicates at least one of a period of the second feedback report and a period of the third feedback report. In an advantageous embodiment, the PTI value indicates a ratio of the second feedback report period to the third feedback report period.

The second feedback report and the third feedback report include selected feedback information comprising at least one of wideband feedback information and subband feedback information. In an advantageous embodiment, the PTI value also indicates the selected feedback information.

A mobile station is provided for use in a wireless network. The mobile station operable to communicate with a base station that transmits using a precoder that is specified by a codebook. The mobile station performs rank-dependent codebook subset selection for subband W2 feedback such that the mobile station transmits to the base station using a first subband W2 codebook when the mobile station transmits a first precoder type indication (PTI) value and transmits to the base station using a second subband W2 codebook when the mobile station transmits a second PTI value. The second subband W2 codebook is a subset of the first subband W2 codebook.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

FIGS. 1 through 12, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged wireless network.

Figure 1:
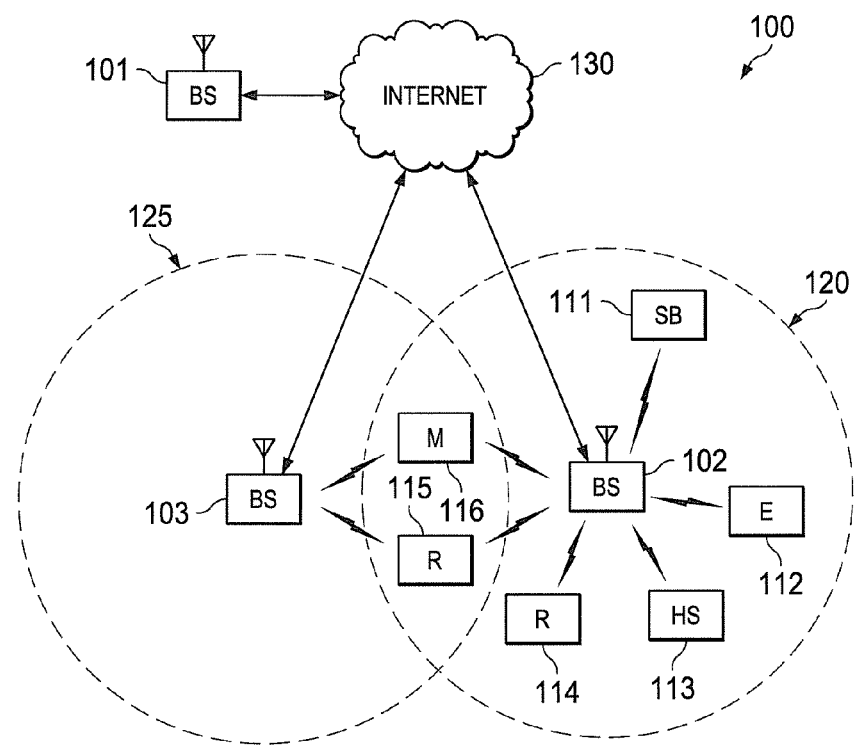
FIG. 1 illustrates an exemplary wireless network that performs feedback for the physical uplink control channel (PUCCH) according to the principles of the present disclosure.

FIG. 1 illustrates exemplary wireless network 100, which performs feedback for the physical uplink control channel (PUCCH) according to the principles of the present disclosure. Wireless network 100 includes base station (BS) 101, base station (BS) 102, base station (BS) 103, and other similar base stations (not shown). Base station 101 is in communication with Internet 130 or a similar IP-based network (not shown).

Depending on the network type, other well-known terms may be used instead of "base station," such as "eNodeB", "eNB", or "access point". For the sake of convenience, the term "base station" shall be used herein to refer to the network infrastructure components that provide wireless access to remote terminals.

Base station 102 provides wireless broadband access to Internet 130 to a first plurality of mobile stations within coverage area 120 of base station 102. The first plurality of subscriber stations includes mobile station 111, which may be located in a small business (SB), mobile station 112, which may be located in an enterprise (E), mobile station 113, which may be located in a WiFi hotspot (HS), mobile station 114, which may be located in a first residence (R), mobile station 115, which may be located in a second residence (R), and mobile station 116, which may be a mobile device (M), such as a cell phone, a wireless laptop, a wireless PDA, or the like.

For the sake of convenience, the term "mobile station" is used herein to designate any remote wireless equipment that wirelessly accesses a base station, whether or not the mobile station is a truly mobile device (e.g., cell phone) or is normally considered a stationary device (e.g., desktop personal computer, vending machine, etc.). In other systems, other well-known terms may be used instead of "mobile station", such as "subscriber station (SS)", "remote terminal (RT)", "wireless terminal (WT)", "user equipment (UE)", and the like.

Base station 103 provides wireless broadband access to Internet 130 to a second plurality of mobile stations within coverage area 125 of base station 103. The second plurality of mobile stations includes mobile station 115 and mobile station 116. In an exemplary embodiment, base stations 101-103 may communicate with each other and with mobile stations 111-116 using OFDM or OFDMA techniques.

While only six mobile stations are depicted in FIG. 1, it is understood that wireless network 100 may provide wireless broadband access to additional mobile stations. It is noted that mobile station 115 and mobile station 116 are located on the edges of both coverage area 120 and coverage area 125. Mobile station 115 and mobile station 116 each communicate with both base station 102 and base station 103 and may be said to be operating in handoff mode, as known to those of skill in the art.

Exemplary descriptions of closed-loop transmit beamforming schemes based on codebook design can be found in: 1) D. Love, J. Heath, and T. Strohmer, "Grassmannian Beamforming For Multiple-Input, Multiple-Output Wireless Systems," IEEE Transactions on Information Theory, October 2003, and 2) V. Raghavan, A. M. Sayeed, and N. Boston, "Near-Optimal Codebook Constructions For Limited Feedback Beamforming In Correlated MIMO Channels With Few Antennas," IEEE 2006 International Symposium on Information Theory. Both references are hereby incorporated by reference into this disclosure as if fully set forth herein.

Closed-loop codebook-based transmit beamforming may be used in a case where a base station forms a transmit antenna beam toward a single user or simultaneously toward multiple users at the same time and at a certain frequency. An exemplary description of such a system may be found in Quentin H. Spencer, Christian B. Peel, A. Lee Swindlehurst, Martin Harrdt, "An Introduction To the Multi-User MIMO Downlink," IEEE Communication Magazine, October 2004, which is hereby incorporated by reference into this disclosure as if fully set forth herein.

A codebook is a set of pre-determined antenna beams that are known to mobile stations. A codebook-based pre-coding MIMO may provide significant spectral efficiency gain in the downlink closed-loop MIMO. In the IEEE 802.16e and 3GPP LTE standards, a four transmit (4-TX) antenna limited feedback based closed-loop MIMO configuration is supported. In IEEE 802.16m and 3GPP LTE Advanced standards, in order to provide peak spectral efficiency, eight transmit (8-TX) antenna configurations are proposed as a prominent precoding closed-loop MIMO downlink system. Exemplary descriptions of such systems may be found in 3GPP Technical Specification No. 36.211, "Evolved Universal Terrestrial Radio Access (E-UTRA): Physical Channel and Modulation", which is hereby incorporated by reference into this disclosure as if fully set forth herein.

To eliminate the need for the phase-calibration process in cases where channel sounding signals or common pilot signals (or midamble) are not used for data demodulation purpose, closed-loop transformed codebook-based transmit beamforming may be utilized. An exemplary description of such a system may be found in IEEE C802.16m-08/1345r2, "Transformation Method For Codebook Based Preceding," November 2008, which is hereby incorporated by reference into this disclosure as if fully set forth herein. The transformed codebook method utilizes the channel correlation information to enhance the performance of the standard codebook, especially in the highly correlated channels, as well as to eliminate the need of phase calibration among multiple transmit antennas. Typically, the channel correlation information is based on second-order statistics and thus changes very slowly, which is similar to long-term channel effects, such as shadowing and path loss. As a result, the feedback overhead and computation complexity using correlation information are very small.

Figure 2:
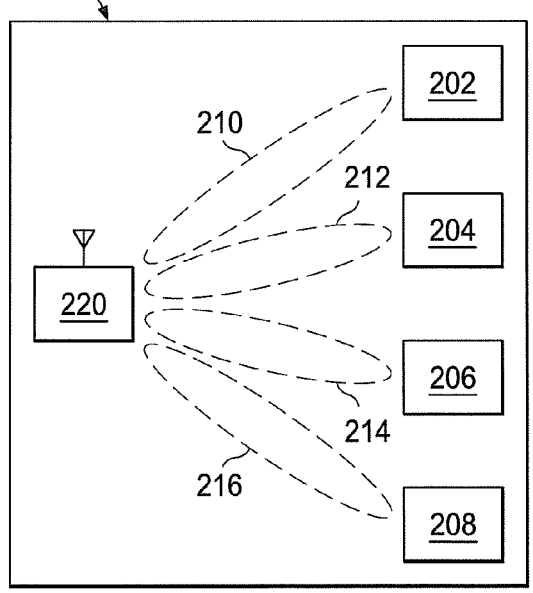
FIG. 2 illustrates a base station in communication with a plurality of mobile stations according to an embodiment of the disclosure.

FIG. 2 illustrates diagram 200 of base station 220 in communication with a plurality of mobile stations 202, 204, 206, and 208 according to an embodiment of the disclosure. Base station 220 and mobile stations 202, 204, 206, and 208 employ multiple antennas for transmission and reception of radio wave signals. The radio wave signals may be Orthogonal Frequency Division Multiplexing (OFDM) signals.

In FIG. 2, base station 220 performs simultaneous beamforming through a plurality of transmitters to each mobile station. For instance, base station 220 transmits data to mobile station 202 through beamformed signal 210, data to mobile station 204 through beamformed signal 212, data to mobile station 406 through beamformed signal 214, and data to mobile station 408 through beamformed signal 216. In some embodiments, base station 220 may perform simultaneous beamforming to mobile stations 202, 204, 206, and 208. Each beamformed signal may be formed toward its intended mobile station at the same time and the same frequency. For the purpose of clarity, the communication from a base station to a mobile station may also be referred to as downlink communication and the communication from a mobile station to a base station may be referred to as uplink communication.

Base station 220 and mobile stations 202, 204, 206, and 208 employ multiple antennas for transmitting and receiving wireless signals. It is understood that the wireless signals may be radio wave signals, and the wireless signals may use any transmission scheme known to one skilled in the art, including an Orthogonal Frequency Division Multiplexing (OFDM) transmission scheme.

Mobile stations 202, 204, 206, and 208 may be any device that is capable of receiving wireless signals. Examples of mobile stations 202, 204, 206, and 208 include, but are not limited to, a personal data assistant (PDA), laptop, mobile telephone, handheld device, or any other device that is capable of receiving the beamformed transmissions.

An OFDM transmission scheme is used to multiplex data in the frequency domain. Modulation symbols are carried on frequency sub-carriers. The quadrature amplitude modulation (QAM) modulated symbols are serial-to-parallel converted and input to the inverse fast Fourier transform (IFFT). At the output of the IFFT, N time-domain samples are obtained. Here N refers to the IFFT/fast Fourier transform (FFT) size used by the OFDM system. The signal after IFFT is parallel-to-serial converted and a cyclic prefix (CP) is added to the signal sequence. The CP is added to each OFDM symbol to avoid or mitigate the impact due to multipath fading. The resulting sequence of samples is referred to as an OFDM symbol with a CP. At the receiver side, assuming that perfect time and frequency synchronization are achieved, the receiver first removes the CP, and the signal is serial-to-parallel converted before being fed into the FFT. The output of the FFT is parallel-to-serial converted, and the resulting QAM modulation symbols are input to the QAM demodulator.

The total bandwidth in an OFDM system is divided into narrowband frequency units called subcarriers. The number of subcarriers is equal to the FFT/IFFT size N used in the system. In general, the number of subcarriers used for data is less than N because some subcarriers at the edge of the frequency spectrum are reserved as guard subcarriers. In general, no information is transmitted on guard subcarriers.

Because each OFDM symbol has finite duration in time domain, the sub-carriers overlap with each other in frequency domain. However, the orthogonality is maintained at the sampling frequency assuming the transmitter and receiver have perfect frequency synchronization. In the case of frequency offset due to imperfect frequency synchronization or high mobility, the orthogonality of the sub-carriers at sampling frequencies is destroyed, resulting in inter-carrier-interference (ICI).

The use of multiple transmit antennas and multiple receive antennas at both a base station and a single mobile station to improve the capacity and reliability of a wireless communication channel is known as a Single User Multiple-Input, Multiple-Output (SU-MIMO) system. A MIMO system provides a linear increase in capacity with K, where K is the minimum of the number of transmit antennas (M) and receive antennas (N) (i.e., K=min(M,N)). A MIMO system can be implemented with the schemes of spatial multiplexing, transmit and receive beamforming, or transmit and receive diversity.

Figure 3:
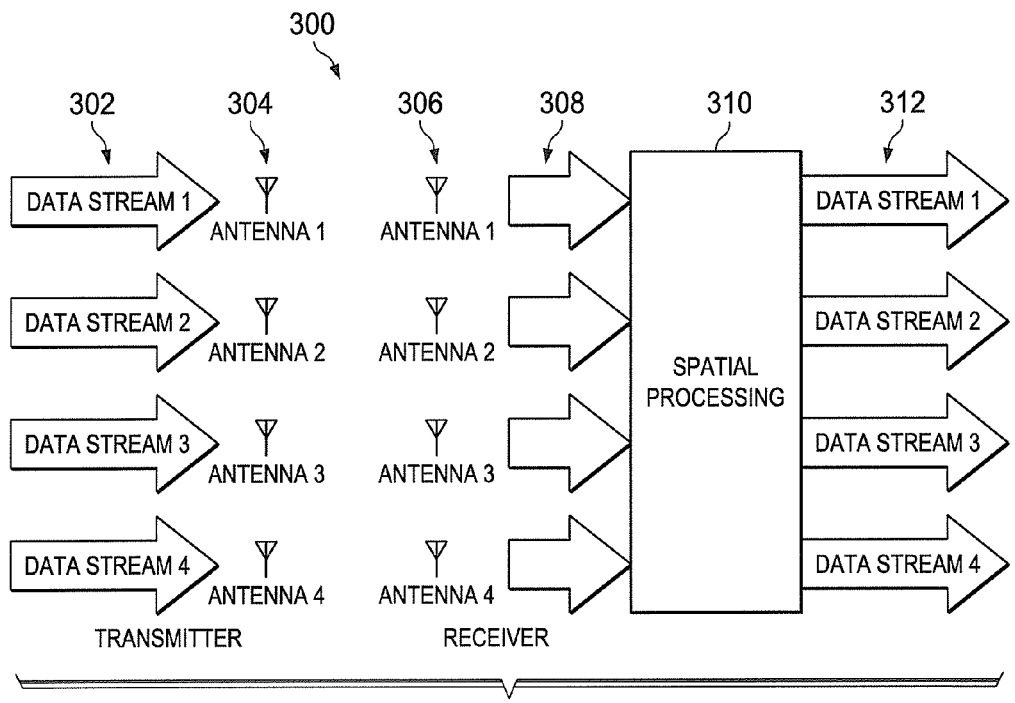
FIG. 3 illustrates a 4×4 multiple-input, multiple-output (MIMO) system according to an embodiment of the disclosure.

FIG. 3 illustrates a 4×4 multiple-input, multiple-output (MIMO) system 300 according to an embodiment of the disclosure. In this example, four different data streams 302 are transmitted separately using four transmit antennas 304. The transmitted signals are received at four receive antennas 306 and interpreted as received signals 308. Some form of spatial signal processing 310 is performed on the received signals 308 in order to recover four data streams 312.

An example of spatial signal processing is Vertical-Bell Laboratories Layered Space-Time (V-BLAST), which uses the successive interference cancellation principle to recover the transmitted data streams. Other variants of MIMO schemes include schemes that perform some kind of space-time coding across the transmit antennas (e.g., Diagonal Bell Laboratories Layered Space-Time (D-BLAST)). In addition, MIMO can be implemented with a transmit and receive diversity scheme and a transmit and receive beamforming scheme to improve the link reliability or system capacity in wireless communication systems.

In channel status indicator (CSI) mode 1, the extension of PUCCH mode 2-1 (i.e., subband feedback mode) allows both the subband feedback and the wideband feedback to be multiplexed in the same feedback mode, depending on the value of the precoder type indication (PTI). More specifically, when PTI=0, both Report 2 and Report 3 are wideband reports and when PTI=1, Report 2 is a wideband report, while Report 3 is a subband report. When PTI=0, since Report 2 and Report 3 are both wideband, it is natural that the feedback periodicity of Report 2 and Report 3 are similar. However, when PTI=1, Report 3 is a subband report, which means that the feedback periodicity of the Report 3 should be smaller relative to the feedback periodicity of Report 2.

Let $N_{P2}$ be the period of Report 2 and $N_{P3}$ be the period of Report 3. By way of example, the unit of the period of both reports may be subframes. Then:

$$H=N_{P2}/N_{P3}+1,$$

where $N_{P2}/N_{P3}$ is the ratio between the period of Report 2 and the period of Report 3. It is noted that the period ratio depends on the PTI value. Thus, in an advantageous embodiment of the disclosure, the value of H depends on the value of PTI. For example, when PTI=0, H=2 or 3, and when PTI=1, H=J*K+1, where J is the number of bandwidth parts and K is a constant that may be signalled from the base station (eNB) using higher layer signalling. In another example, when PTI=0, the value of H may be signalled by higher layers and when PTI=1, then H=J*K+1, where J is the number of bandwidth parts and K is a constant signalled by the base station using higher layer signalling.

Let $N_{P1}$ be the period of Report 1, then:

$$M=N_{P1}/N_{P2}.$$

In an advantageous embodiment of the disclosure, the value of M also depends on the value of PTI. Furthermore, let $M^0$ and $H^0$ be the periodicity ratios when PTI=0, and let $M^1$ and $H^1$ be the periodicity ratios when PTI=1. Then, then the following condition among the four quantities holds:

$$H^0*M^0=H^1*M^1.$$

For a particular example, assume 10 MHz total system bandwidth. Accordingly, J=3 bandwidth parts (BPs). If K=1, then $H^1$=4. If $M^1$=2, then $H^1*M^1$=4*2=8=$H^0*M^0$=2*4.

In some embodiments of the disclosure, the exact value of H and/or M may be signalled using higher layer signalling.

Figure 4:
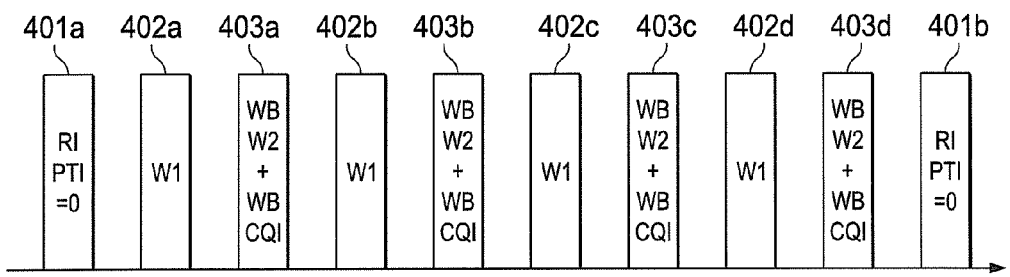
FIG. 4 illustrates feedback reports for a precoder type indicator (PTI) value of 0.
Figure 5:
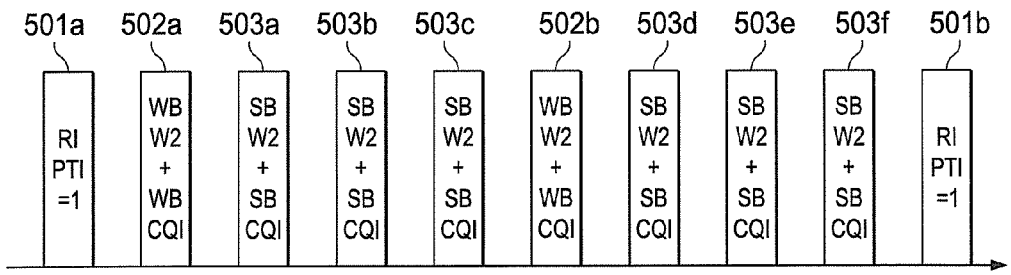
FIG. 5 illustrates feedback reports for a precoder type indicator (PTI) value of 01.

The feedback reports from mobile station (MS) to base station (BS) are seen more clearly in FIG. 4 and FIG. 5.

FIG. 4 illustrates feedback reports for a precoder type indicator (PTI) value of 0. In FIG. 4, $H^0$=2 and $M^0$=4. Messages 401a and 401b are examples of Report 1, which contains Rank Indicator (RI) and a 1-bit PTI value=0. Messages 402a, 402b, 402c, and 402d are examples of Report 2, which contains the precoder matrix value, W1 (also referred to as "a first PMI"). Messages 403a, 403b, 403c, and 403d are examples of Report 3, which contains the wideband precoder matrix value (WB W2) and a wideband channel quality indicator (WB CQI) value.

Thus, for each instance of Report 1, there are 4 instances of Report 2 and 4 instances of Report 3 (i.e., M=4, since period of Report 1 is 4 times period of Report 2). Also, for each instance of Report 2, there is one instance of Report 3 (i.e., H=2, since period of Report 2 equals period of Report 3).

FIG. 5 illustrates feedback reports for a precoder type indicator (PTI) value of 1. In FIG. 5, $H^1$=4 and $M^1$=2. Messages 501a and 501b are examples of Report 1, which contains Rank Indicator (RI) and a 1-bit PTI value=1. Messages 502a and 502b are examples of Report 2, which contains the wideband precoder matrix value, WB W2, and the WB CQI value. Messages 503a, 503b and 503c are examples of Report 3, which contains the subband precoder matrix value, SB W2, and the subband channel quality indicator (SB CQI) value.

Thus, for each instance of Report 1, there are 2 instances of Report 2 and 6 instances of Report 3 (i.e., M=2, since the period of Report 1 is 2 times the period of Report 2). Also, for each instance of Report 2, there are three instances of Report 3 (i.e., H=4, since period of Report 2 is 3 times the period of Report 3).

In the example, no feedback information related to W1 is reported following the rank report when PTI=1. This means that in order to perform subband-based feedback, the mobile station may feedback PTI=0 first. However, during the next RI feedback, the mobile station ensures the same W1 is reported in the previous subframe. Otherwise, the mobile station should not perform subband feedback. This may restrict scheduling flexibility in the base station and may increase the complexity of the mobile station.

In an advantageous embodiment of the disclosure, wideband feedback information is transmitted in the feedback report (Report 2) following Report 1, where PTI=1.

In a first alternative embodiment (ALT 1), the W1 information is reported together with wideband W2 and wideband CQI in Report 2 when PTI=1. Thus, Report 1 includes RI and 1-bit precoder type indication (PTI). In Report 2, if PTI=0, then W1 is reported. If PTI=1, then W1, wideband CQI, and wideband W2 are reported. In Report 3, if PTI=0, then wideband CQI and wideband W2 are reported. If PTI=1, then subband CQI and subband W2 are reported. The first alternative embodiment is depicted in FIG. 6.

Figure 6:
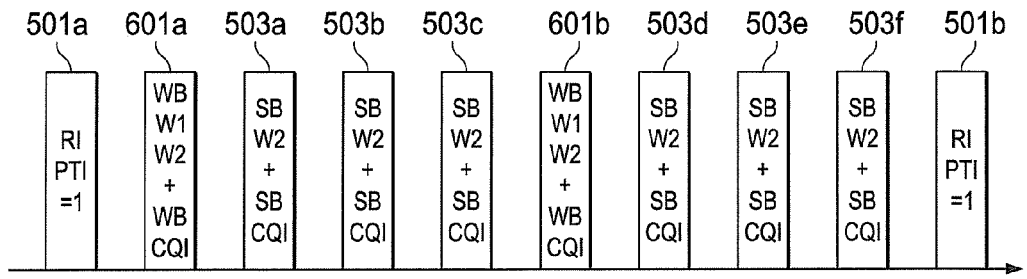
FIG. 6 illustrates modified feedback reports for a precoder type indicator (PTI) value of 1 in a first alternate embodiment.

FIG. 6 illustrates modified feedback reports for a precoder type indicator (PTI) value of 1 in the first alternate embodiment. In FIG. 6, $H^1$=4 and $M^1$=2. FIG. 6 is similar to FIG. 5 in many respects. Messages 501a and 501b are examples of Report 1, which contains Rank Indicator (RI) and a 1-bit PTI value=1. Similarly, messages 503a, 503b and 503c are examples of Report 3, which contains the subband precoder matrix value, SB W2, and the subband channel quality indicator (SB CQI) value. However, messages 601a and 601b are new. Messages 601a and 601b are examples of Report 2. Since PTI=1, messages 601a and 601b include wideband W1, wideband W2, and wideband CQI.

Furthermore, in order to limit the maximum payload size of Report 2 to 11 bits, codebook subset selection (codebook sub-sampling) is performed on the codebook of W1 and/or the codebook of W2. Accordingly, conditioned on the value of PTI, the codebook of W1 can be either sub-sampled or not sub-sampled. If PTI=0, then C1 (the codebook of W1) is not sub-sampled (codebook subset selection is not applied to C1). If PTI=1, then C1 (the codebook of W1) is sub-sampled (codebook subset selection is applied to C1).

In a second alternative embodiment (ALT 2), the W1 information is reported together with wideband CQI in Report 2 when PTI=1. Thus, Report 1 includes RI and 1-bit precoder type indication (PTI). In Report 2, if PTI=0, then W1 is reported. If PTI=1, then W1 and wideband CQI are reported. In Report 3, if PTI=0, then wideband CQI and wideband W2 are reported. If PTI=1, then subband CQI and subband W2 are reported. The second alternative embodiment is depicted in FIG. 7.

Figure 7:
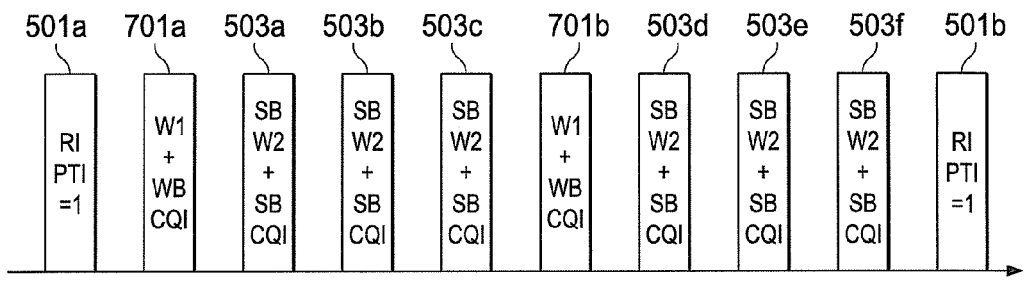
FIG. 7 illustrates modified feedback reports for a precoder type indicator (PTI) value of 1 in a second alternate embodiment.

FIG. 7 illustrates modified feedback reports for a precoder type indicator (PTI) value of 1 in the second alternate embodiment. In FIG. 7, $H^1$=4 and $M^1$=2. FIG. 7 is similar to FIGS. 5 and 6 in many respects. Messages 501a and 501b are examples of Report 1, which contains Rank Indicator (RI) and a 1-bit PTI value=1. Similarly, messages 503a, 503b and 503c are examples of Report 3, which contains the subband precoder matrix value, SB W2, and the subband channel quality indicator (SB CQI) value. However, messages 701a and 701b are new. Messages 701a and 701b are examples of Report 2. Since PTI=1, messages 701a and 701b include wideband W1 and wideband CQI.

In a third alternative embodiment (ALT 3), the W1 information is reported in Report 2 when PTI=1. Thus, Report 1 includes RI and 1-bit precoder type indication (PTI). In Report 2, if PTI=0, then W1 is reported. If PTI=1, then W1 is reported. In Report 3, if PTI=0, then wideband CQI and wideband W2 are reported. If PTI=1, then subband CQI and subband W2 are reported. The third alternative embodiment is depicted in FIG. 8.

Figure 8:
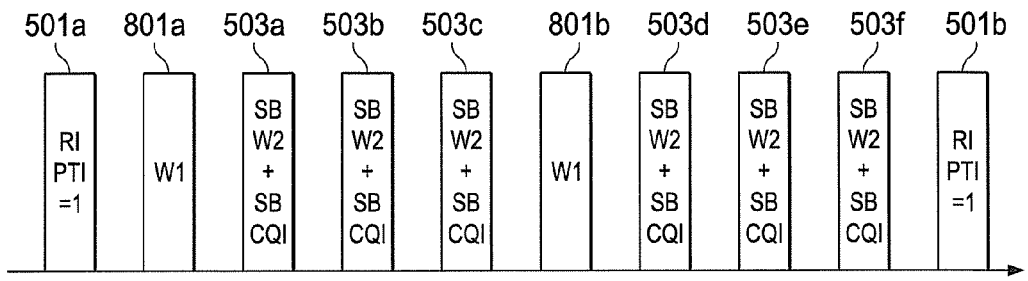
FIG. 8 illustrates modified feedback reports for a precoder type indicator (PTI) value of 1 in a third alternate embodiment.

FIG. 8 illustrates modified feedback reports for a precoder type indicator (PTI) value of 1 in the third alternate embodiment. In FIG. 8, $H^1$=4 and $M^1$=2. FIG. 8 is similar to FIGS. 5-7 in many respects. Messages 501a and 501b are examples of Report 1, which contains Rank Indicator (RI) and a 1-bit PTI value=1. Similarly, messages 503a, 503b and 503c are examples of Report 3, which contains the subband precoder matrix value, SB W2, and the subband channel quality indicator (SB CQI) value. However, messages 801a and 801b are new. Messages 801a and 801b are examples of Report 2. Since PTI=1, messages 801a and 801b include wideband W1.

In still another embodiment of the disclosure, a new report is added when PTI=1. Thus, there will be four reports in this CSI mode. However, the precoder W is determined on a 3-subframe report conditioned on the last rank indicator (RI) value transmitted. Thus, Report 1 includes RI and 1-bit precoder type indication (PTI). In Report 2, if PTI=0, then W1 is reported and if PTI=1, then W1 is reported (similar to FIG. 8). In Report 3, if PTI=0, then wideband CQI and wideband W2 are reported and if PTI=1, then wideband CQI and wideband W2 are reported. In Report 4, if PTI=0, there is no report. If PTI=1, then subband CQI and subband W2 are reported.

In this way, PTI serves to turn on/off subband CQI report and Report 4 (subband CQI/W2) is only reported when PTI=1. This alternative embodiment is depicted in FIG. 9.

Figure 9:
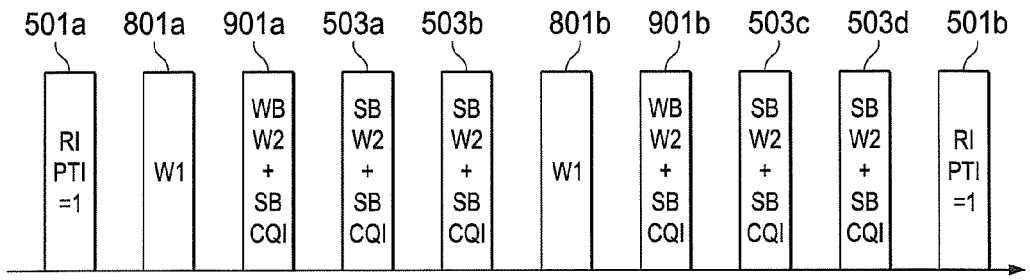
FIG. 9 illustrates modified feedback reports for a precoder type indicator (PTI) value of 1 in which four report types are used.

FIG. 9 illustrates modified feedback reports for a precoder type indicator (PTI) value of 1 in which four report types are used. FIG. 9 is similar to FIGS. 5-8 in many respects. Messages 501a and 501b are examples of Report 1, which contains Rank Indicator (RI) and a 1-bit PTI value=1. Messages 801a and 801b are examples of Report 2. Since PTI=1, messages 801a and 801b include wideband W1. Similarly, messages 503a and 503b are examples of Report 3, which contains SB W2 and SB CQI.

However, messages 901a and 901b are new. Messages 901a and 901b are example of Report 4. Since PTI=1, messages 901a and 901b include subband CQI and subband W2. If PTI had been 0, there would be no Report 4.

In an advantageous embodiment of the present disclosure, when PTI=1, the feedback periods of Report 2 and Report 3 are the same and the following conditions hold:

$N_{P2}=N_{P3}$;

$H=N_{P2}/N_{P4}=J*K+2$; and $M=N_{P1}/N_{P2}$.

According to the codebook agreement in Document No. R1-105011 and the Chairman's notes, the payloads for W2 are listed as follows: Rank 1=4 bits, Rank 2=4 bits, Rank 3=4 bits, and Rank 4=3 bits. The bit-widths of Report 3 when PTI=1 is shown in TABLE 1 below.

TABLE 1

| RANK | W2 | CQI | L-BIT SUBBAND INDICATION | TOTAL PAYLOAD |
|---|---|---|---|---|
| RANK 1 | 4 BITS | 4 BITS | 1-2 BITS DEPENDING ON BW | 10 |
| RANK 2 | 4 BITS | 4 + 3 BITS | 1-2 BITS DEPENDING ON BW | 13 |
| RANK 3 | 4 BITS | 4 + 3 BITS | 1-2 BITS DEPENDING ON BW | 13 |
| RANK 4 | 3 BITS | 4 + 3 BITS | 1-2 BITS DEPENDING ON BW | 12 |
| RANK 5-8 | 0 BITS | 4 + 3 BITS | 1-2 BITS DEPENDING ON BW | 9 |

However, it is already agreed that the payload of PUCCH format 2 should be restricted to 11 bits. Therefore, as shown in TABLE 1, for rank 2 (13 bits), rank 3 (13 bits) and rank 4 (12 bits, the bit-widths of the current payloads of PUCCH format 2 cannot accommodate both subband W2, subband CQI and L-bit bandwidth part (BP) indication in TABLE 1.

In one embodiment of disclosure, the L-bit subband indicator in the Rel-8 subband CQI feedback is retained. However, the following alternatives are used to constrain the payload of subband feedback to within 11 bits.

Alternative 1:

Codebook subset selection (codebook sub-sampling) is performed for subband W2 in CSI mode 1. That is, the codebook of W2 (C2) for subband feedback in PUCCH feedback is a subset of the codebook of W2 for wideband feedback in PUCCH feedback. For example, C2 of W2, when PTI=1, is a subset of C2 of W2 when PTI=0 in PUCCH feedback. Also, C2 of W2, when PTI=1, in PUCCH feedback is a subset of C2 of W2 in PUSCH feedback. For the example where C2 is sub-sampled and the payload for the sub-sampled C2 is 2 bits, TABLE 2 below shows the payloads for subband CQI feedback in CSI mode 1.

TABLE 2

| RANK | W2 | CQI | L-BIT SUBBAND INDICATION | TOTAL PAY-LOAD |
|---|---|---|---|---|
| RANK 1 | 2 BITS | 4 BITS | 1-2 BITS DEPENDING ON BW | 8 |
| RANK 2 | 2 BITS | 4 + 3 BITS | 1-2 BITS DEPENDING ON BW | 11 |
| RANK 3 | 2 BITS | 4 + 3 BITS | 1-2 BITS DEPENDING ON BW | 11 |
| RANK 4 | 2 BITS | 4 + 3 BITS | 1-2 BITS DEPENDING ON BW | 11 |
| RANK 5-8 | 0 BITS | 4 + 3 BITS | 1-2 BITS DEPENDING ON BW | 9 |

Alternative 1:

Rank dependent codebook subset selection (codebook sub-sampling) is performed for subband W2 feedback when PTI=1. For example, Rank 2/3/4 codebook of W2 when PTI=1 is a subset of W2 when PTI=0 in PUCCH feedback. Also, Rank 2/3/4 codebook of W2 when PTI=1 in PUCCH feedback is a subset of W2 in PUSCH feedback. For the example where the C2 is sub-sampled and the payload for the sub-sampled C2 is 2 bits for rank 2/3/4, TABLE 3 below shows the payloads for subband CQI feedback in CSI mode 1.

TABLE 3

| RANK | W2 | CQI | L-BIT SUBBAND INDICATION | TOTAL PAY-LOAD |
|---|---|---|---|---|
| RANK 1 | 4 BITS | 4 BITS | 1-2 BITS DEPENDING ON BW | 10 |
| RANK 2 | 2 BITS | 4 + 3 BITS | 1-2 BITS DEPENDING ON BW | 11 |
| RANK 3 | 2 BITS | 4 + 3 BITS | 1-2 BITS DEPENDING ON BW | 11 |
| RANK 4 | 2 BITS | 4 + 3 BITS | 1-2 BITS DEPENDING ON BW | 11 |
| RANK 5-8 | 0 BITS | 4 + 3 BITS | 1-2 BITS DEPENDING ON BW | 9 |

In another embodiment of the disclosure, the L-bit subband indication is removed for all ranks. In addition, between every two consecutive Report 2 instances, the remaining H-1 or H-2 (depending on whether wideband W2 and wideband CQI are separately reported from W1) reporting instances are used in sequence for subband CQI/W2 reports to cycle through the bandwidth part together with the subband within the bandwidth part. For example, when H=J*K+1 and wideband W2/CQI are sent together with W1, there are J*K(H-1) reporting instances between the two consecutive Report 2 feedback instances.

The present disclosure proposes multiple orders to cycle through bandwidth part and subband within the corresponding bandwidth part in the assigned subband reporting instances.

Figure 10:
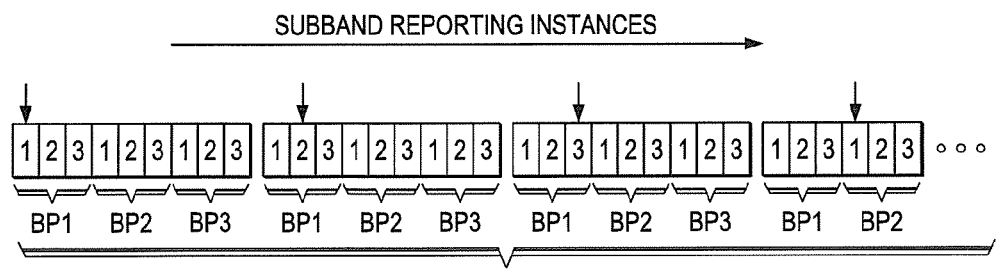
FIG. 10 illustrates subband reporting instances for subband CQI/W2 reporting according to a first alternative embodiment of the disclosure.

Alternative 1:

Between two consecutive Report 2 feedbacks, the remaining J*K(H-1) or J*K(H-2) reporting instances are used in sequence for subband CQI/W2 reports on each subband. FIG. 10 illustrates subband reporting instances for subband CQI/W2 reporting according to the first alternative embodiment of the disclosure. In FIG. 10, three bandwidth parts, BP1, BP2, and BP3 are shown. The first three reporting instances sequence through each of the three subbands of bandwidth part BP1. The fourth reporting instance then begins sequencing through bandwidth part BP2.

Figure 11:
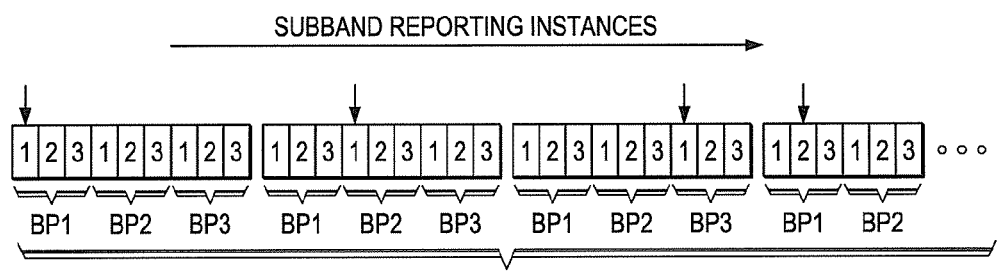
FIG. 11 illustrates subband reporting instances for subband CQI/W2 reporting according to a second alternative embodiment of the disclosure.
Figure 12:
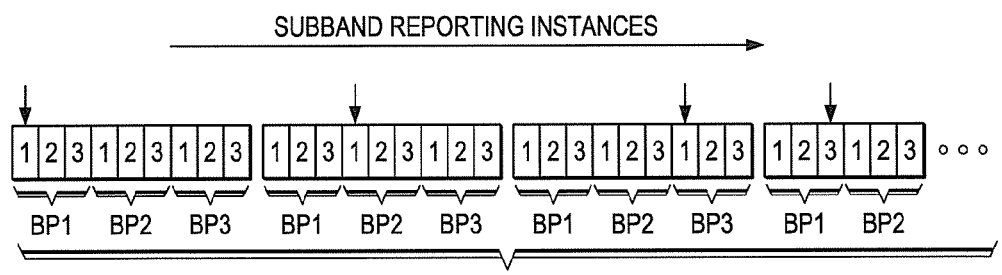
FIG. 12 illustrates subband reporting instances for subband CQI/W2 reporting according to a third alternative embodiment of the disclosure.

Alternative 2:

Between two consecutive Report 2 feedbacks, the remaining J*K(H-1) or J*K(H-2) reporting instances are used in sequence for subband CQI/W2 reports on K cycles of bandwidth parts. Furthermore, within the $i^{th}$ cycle of a bandwidth part, the mobile station reports the $i^{th}$ subband bandwidth within each bandwidth part. FIG. 11 illustrates subband reporting instances for subband CQI/W2 reporting according to the second alternative embodiment of the disclosure. In FIG. 11, three bandwidth parts, BP1, BP2, and BP3 are shown. The first three reporting instances sequence through the first subband of each of bandwidth parts BP1, BP2 and BP3. The fourth reporting instance then begins sequencing through the second subband of each of bandwidth parts BP1, BP2 and BP3.

Alternative 3:

Between two consecutive Report 2 feedbacks, the remaining J*K(H-1) or J*K(H-2) reporting instances are used in sequence for subband CQI/W2 reports on K cycles of bandwidth parts. Furthermore, assuming there are at most $T=2^L$ subbands within each bandwidth part, then within the $i^{th}$ cycle of a bandwidth part, the mobile station reports the $i^{th}$ subband bandwidth with each bandwidth part.

By way of example, the mapping between i and j for the case K=4 and T=4 shown below in TABLE 4 may be used.

TABLE 4

| i | j |
|---|---|
| 1 | 1 |
| 2 | T |
| 3 | 2 |
| 4 | T-1 |

In general, for k=1, 2, 3, . . . , if i=2*k-1, then j=k, and if i=2*k, then j=T-k+1.

FIG. 11 illustrates subband reporting instances for subband CQI/W2 reporting according to the third alternative embodiment of the disclosure.

In one embodiment of the present disclosure, the subband size within a bandwidth part depends on the rank indicator. That is, there may be larger subband sizes for higher ranks. Furthermore, the subband CQI/W2 feedback pattern depends on different ranks, as well.

In one embodiment of the present disclosure, the L-bit subband indication for rank 2, 3, 4 feedback may be removed while keeping the L-bit subband indication for rank 1 and ranks 5-8. Accordingly, TABLE 5 below shows the payload sized for subband CQI feedback in CSI mode 1 that may be achieved. In one embodiment, RI and PTI may be jointly encoded in CSI mode 1.

TABLE 5

| RANK | W2 | CQI | L-BIT SUBBAND INDICATION | TOTAL PAYLOAD |
|---|---|---|---|---|
| RANK 1 | 4 BITS | 4 BITS | 1-2 BITS DEPENDING ON BW | 10 |
| RANK 2 | 4 BITS | 4 + 3 BITS | 0 | 11 |
| RANK 3 | 4 BITS | 4 + 3 BITS | 0 | 11 |
| RANK 4 | 3 BITS | 4 + 3 BITS | 0 | 10 |
| RANK 5-8 | 0 BITS | 4 + 3 BITS | 1-2 BITS DEPENDING ON BW | 9 |

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. For use in a wireless network, a mobile station operable to transmit feedback reports to a base station of the wireless network,
the feedback reports comprising a first feedback report, a second feedback report and a third feedback report,
wherein the first feedback report includes a precoder type indication (PTI) value and
wherein at least one of a period of the second feedback report and a period of the third feedback report is indicated by the PTI value.

2. The mobile station as set forth in claim 1, wherein the PTI value indicates a ratio of the second feedback report period to the third feedback report period.

3. The mobile station as set forth in claim 2, wherein when the PTI value is 0, the ratio is signaled by a higher-layer message and when the PTI value is 1, the ratio is given by J*K+1, where J is the number of bandwidth parts and K is a constant signaled by a higher layer message.

4. The mobile station as set forth in claim 1, wherein the second feedback report and the third feedback report include selected feedback information, the selected feedback information comprising at least one of wideband feedback information and subband feedback information.

5. The mobile station as set forth in claim 4, wherein the PTI value indicates the selected feedback information.

6. A method for use in a mobile station operable to transmit feedback reports to a base station of a wireless network, the method including:
transmitting to the base station a first feedback report including a precoder type indication (PTI) value;
transmitting to the base station a second feedback report; and
transmitting to the base station a third feedback report,
wherein the PTI value indicates at least one of a period of the second feedback report and a period of the third feedback report.

7. The method as set forth in claim 6, wherein the PTI value indicates a ratio of the second feedback report period to the third feedback report period.

8. The method as set forth in claim 7, wherein when the PTI value is 0, the ratio is signaled by a higher-layer message and when the PTI value is 1, the ratio is given by J*K+1, where J is the number of bandwidth parts and K is a constant signaled by a higher layer message.

9. The method as set forth in claim 6, wherein the second feedback report and the third feedback report include selected feedback information, the selected feedback information comprising at least one of wideband feedback information and subband feedback information.

10. The method as set forth in claim 9, wherein the PTI value indicates the selected feedback information.

11. For use in a wireless network, a base station operable to receive feedback reports transmitted by a mobile station,
the feedback reports comprising a first feedback report, a second feedback report and a third feedback report,
wherein the base station is configured to identify in the first feedback report a precoder type indication (PTI) value, and
wherein the base station is configured to use the PTI value to determine at least one of a period of the second feedback report and a period of the third feedback report.

12. The base station as set forth in claim 11, wherein base station is configured to use the PTI value to determine a ratio of the second feedback report period to the third feedback report period.

13. The base station as set forth in claim 12, wherein the base station is configured to receive from the mobile station a control signal indicating the ratio.

14. The base station as set forth in claim 11, wherein the second feedback report and the third feedback report include selected feedback information, the selected feedback information comprising at least one of wideband feedback information and subband feedback information.

15. The base station as set forth in claim 14, wherein the base station is configured to use the PTI value to determine the selected feedback information.

16. A method for use in a base station of a wireless network operable to receive feedback reports transmitted by a mobile station, the method comprising:
receiving a first feedback report;
identifying in the first feedback report a precoder type indication (PTI) value;
determining from the PTI value at least one of a period of a second feedback report and a period of a third feedback report;
receiving the second feedback report; and
receiving the third feedback report.

17. The method as set forth in claim 16, further comprising determining a ratio of the second feedback report period to the third feedback report period.

18. The method as set forth in claim 17, wherein the base station receives from the mobile station a control signal indicating the ratio.

19. The method as set forth in claim 16, wherein the second feedback report and the third feedback report include selected feedback information, the selected feedback information comprising at least one of wideband feedback information and subband feedback information.

20. The method as set forth in claim 19, further comprising determining from the PTI value the selected feedback information.

* * * * *